(12) United States Patent
Masuda et al.

(10) Patent No.: US 7,549,428 B2
(45) Date of Patent: Jun. 23, 2009

(54) SUBSTRATE PROCESSING APPARATUS

(75) Inventors: Hiroshi Masuda, Horikawa-dori (JP); Hiroyuki Araki, Horikawa-dori (JP)

(73) Assignee: Dainippon Screen Mfg. Co., Ltd. (JP)

( * ) Notice: Subject to any disclaimer, the term of this patent is extended or adjusted under 35 U.S.C. 154(b) by 722 days.

(21) Appl. No.: 11/190,620

(22) Filed: Jul. 27, 2005

(65) Prior Publication Data

US 2006/0021639 A1 Feb. 2, 2006

(30) Foreign Application Priority Data

Jul. 28, 2004 (JP) ............................. 2004-220256

(51) Int. Cl.
*B08B 3/04* (2006.01)
(52) U.S. Cl. ..................... 134/76; 134/140; 134/902
(58) Field of Classification Search ............... 134/56 R, 134/71, 76, 184, 198
See application file for complete search history.

(56) References Cited

U.S. PATENT DOCUMENTS

| | | | | |
|---|---|---|---|---|
| 5,266,812 A | * | 11/1993 | Mokuo | 250/559.4 |
| 5,960,562 A | * | 10/1999 | Nishida et al. | 34/574 |
| 6,082,381 A | * | 7/2000 | Kamikawa et al. | 134/57 R |
| 6,119,367 A | * | 9/2000 | Kamikawa et al. | 34/401 |
| 6,200,387 B1 | * | 3/2001 | Ni | 118/722 |
| 6,889,108 B2 | | 5/2005 | Tanaka et al. | |
| 2004/0050408 A1 | * | 3/2004 | Christenson et al. | 134/184 |
| 2005/0039779 A1 | | 2/2005 | Ohtsuka | |

FOREIGN PATENT DOCUMENTS

| | | | |
|---|---|---|---|
| JP | 5-152423 | * | 6/1993 |
| JP | 7-169822 | * | 7/1995 |
| JP | 11-145241 | * | 5/1999 |

* cited by examiner

*Primary Examiner*—Frankie L Stinson
(74) *Attorney, Agent, or Firm*—Ostrolenk, Faber, LLP

(57) ABSTRACT

A substrate processing apparatus includes a photosensor for detecting the presence/absence of a substrate in each place within a carrier cassette, a pair of processing tanks for performing the same process at the same time, and a supply mechanism for supplying a processing solution to the processing tanks independently. The number of substrates is detected in accordance with the result of the detection of the photosensor. If the number of substrates detected is not greater than an allowable number for one of the processing tanks, the processing solution is supplied to only the one processing tank to perform the process. This reduces the consumption of the processing solution in a batch process.

7 Claims, 5 Drawing Sheets

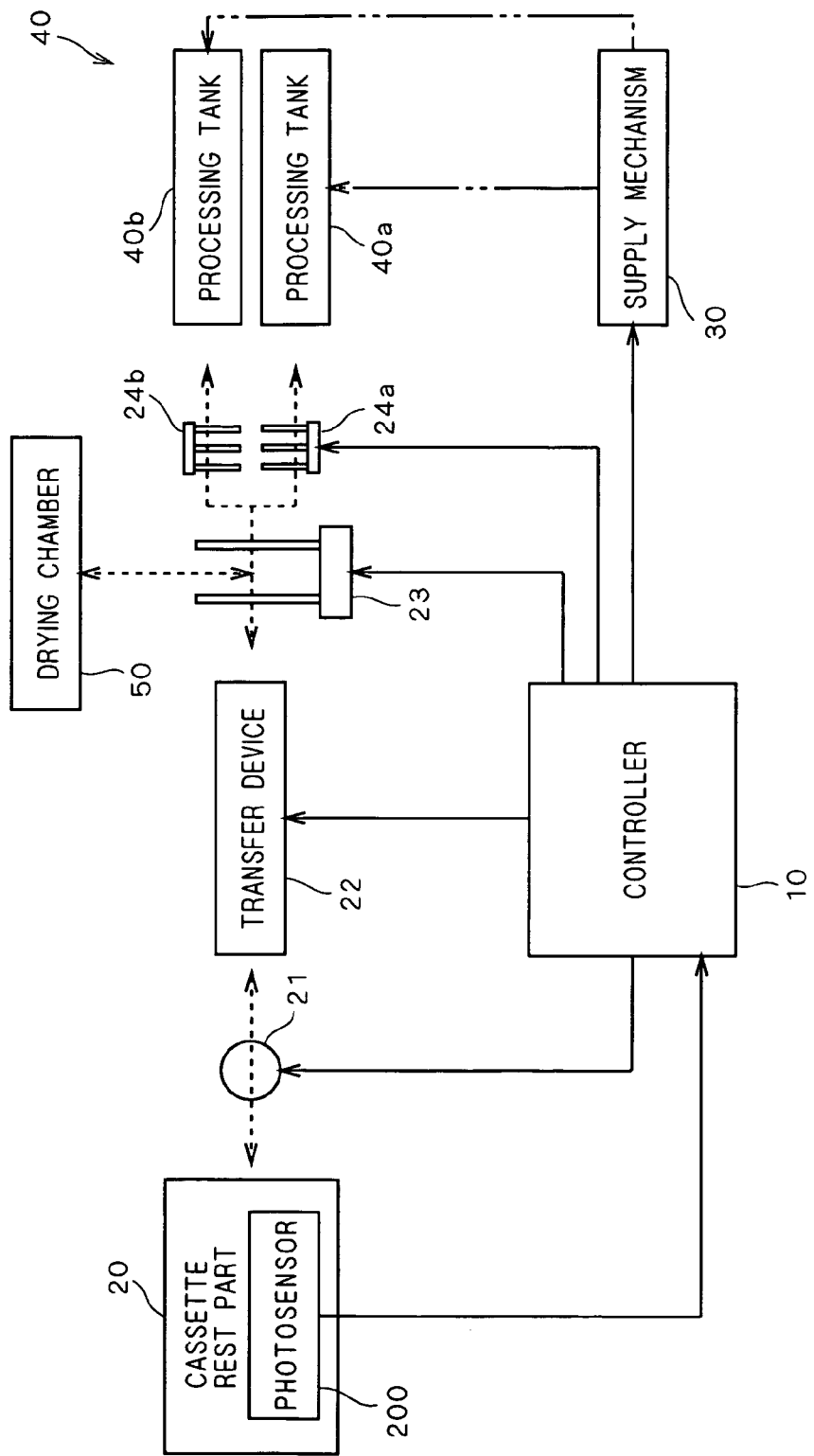
F I G . 2

F I G . 6
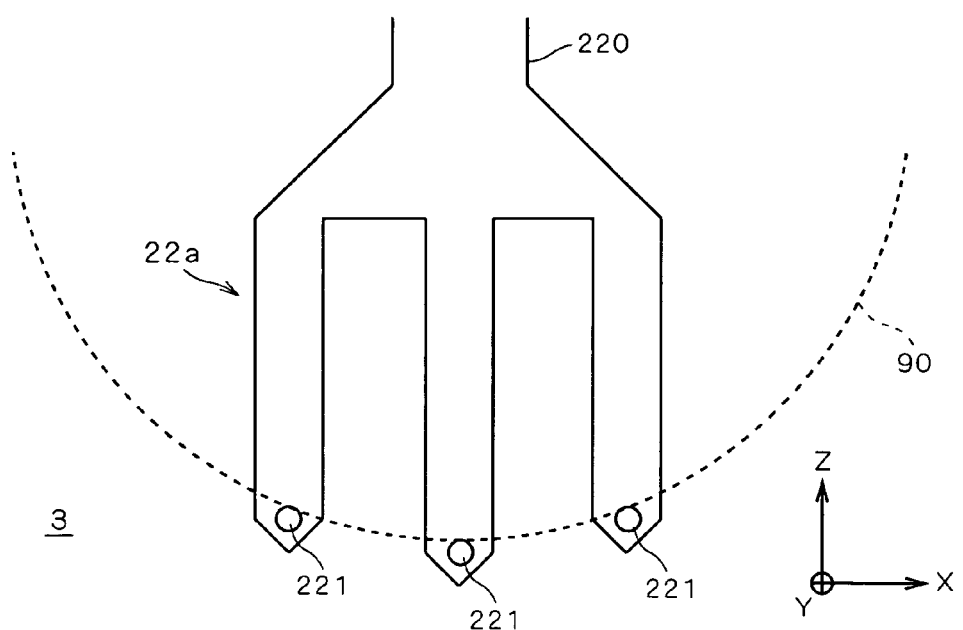

SUBSTRATE PROCESSING APPARATUS

BACKGROUND OF THE INVENTION

1. Field of the Invention

The present invention relates to a technique for processing a plurality of substrates by immersing the plurality of substrates in a processing solution stored in a processing tank. More particularly, the present invention relates to a technique for reducing the consumption of a processing solution in such processing.

2. Description of the Background Art

A substrate processing apparatus for performing a batch cleaning process on a plurality of substrates (or a batch of N substrates where N is a natural number not less than two) at the same time is used in a process step of manufacturing the substrates. Such a substrate processing apparatus performs the cleaning process in such a manner as to previously fill a processing tank which can accommodate a maximum number of substrates per batch to be transported thereto with a cleaning solution and to immerse a batch of N substrates actually transported thereto into the cleaning solution at a time.

The actual manufacturing process step, however, has presented a problem in that a maximum number of N substrates per batch are not always transported to the substrate processing apparatus. For example, a processing tank which can accommodate 50 substrates must be supplied with an amount of cleaning solution which fills the processing tank even for the cleaning of less than 50 substrates. Thus, there has been a problem such that the cleaning solution for 50 substrates is consumed even when less than 50 substrates are cleaned. In particular, this problem grows as a demand for the manufacturing of a wide variety of products in small quantities increases.

SUMMARY OF THE INVENTION

The present invention is intended for a technique for processing a plurality of substrates by immersing the plurality of substrates in a processing solution stored in a processing tank.

According to an aspect of the present invention, a substrate processing apparatus for performing a predetermined process on a substrate comprises: a plurality of processing tanks each capable of accommodating a plurality of substrates and storing a processing solution therein; a detector for detecting the number of substrates; a selector for selecting a processing tank for use in processing the substrates from among the plurality of processing tanks in accordance with the number of substrates detected by the detector; a supply mechanism for supplying the processing solution to the processing tank selected by the selector; and a transport mechanism for transporting the substrates to the processing tank selected by the selector.

The amount of processing solution supplied becomes equal to the volumetric capacity of the selected processing tank. Therefore, the substrate processing apparatus reduces the consumption of the processing solution.

According to another aspect of the present invention, the substrate processing apparatus comprises: a processing tank capable of accommodating a plurality of substrates and storing a processing solution therein; a detector for detecting the number of substrates; a volumetric capacity determiner for determining a working volumetric capacity in the processing tank in accordance with the number of substrates detected by the detector; a volumetric capacity changing mechanism for changing the volumetric capacity of the processing tank to the working volumetric capacity determined by the volumetric capacity determiner; a supply mechanism for supplying the processing solution to the processing tank whose volumetric capacity is changed to the working volumetric capacity by the volumetric capacity changing mechanism; and a transport mechanism for transporting the substrates to the processing tank whose volumetric capacity is changed to the working volumetric capacity by the volumetric capacity changing mechanism.

The amount of processing solution supplied becomes equal to an amount which depends on the working volumetric capacity. Therefore, the substrate processing apparatus reduces the consumption of the processing solution.

It is therefore an object of the present invention to provide a substrate processing apparatus capable of reducing the consumption of a processing solution.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows connections between a controller and other constituents and transport paths for substrates;

FIG. 6 shows a transport arm of a transfer device according to a third preferred embodiment of the present invention.

DESCRIPTION OF THE PREFERRED EMBODIMENTS

Figure 1:
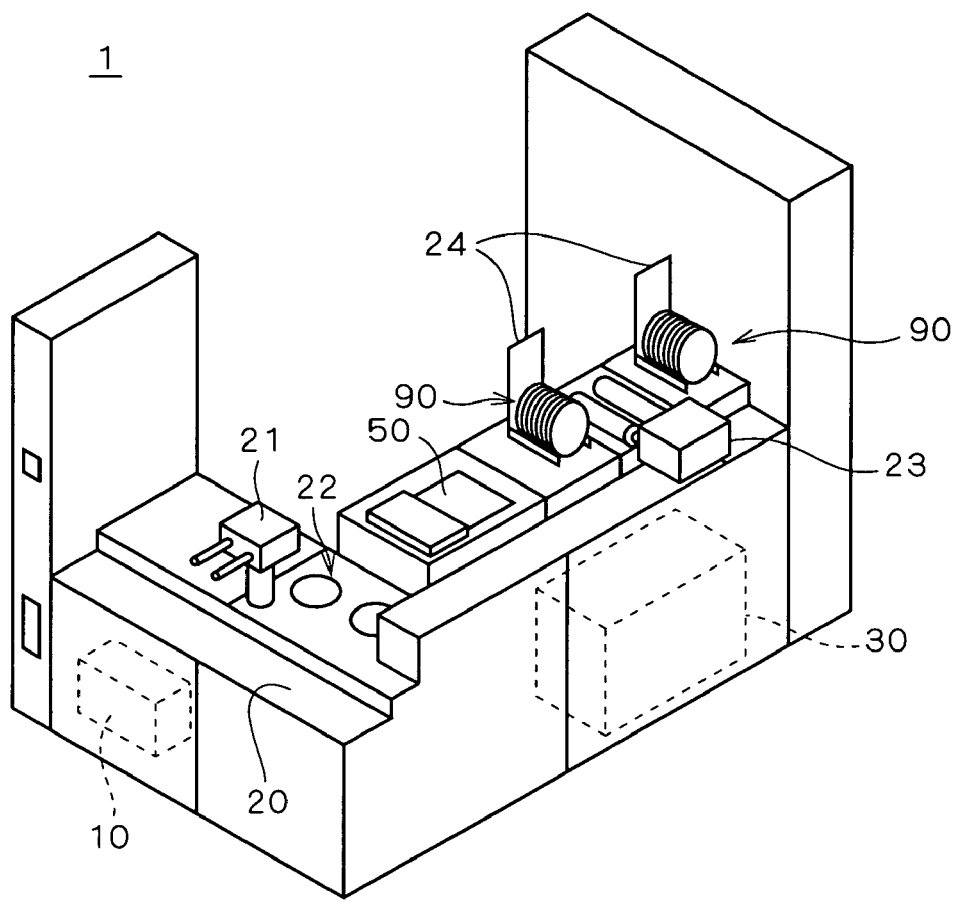
FIG. 1 is a schematic perspective view of a substrate processing apparatus according to a first preferred embodiment of the present invention.

FIG. 1 is a schematic perspective view of a substrate processing apparatus 1 according to a first preferred embodiment of the present invention. For purposes of illustration, parts of an enclosure, a display part, an internal structure and the like are not shown in FIG. 1.

The substrate processing apparatus 1 includes a cassette rest part 20, a cassette transport robot 21, a transfer device 22, a substrate transport robot 23, lifters 24, processing tanks 40 (FIG. 2), and a drying chamber 50. The substrate processing apparatus 1 further includes a controller 10 and a supply mechanism 30 both incorporated therein.

FIG. 2 is a block diagram showing electrical connections between the controller 10 and other constituents and transport paths for substrates 90. In FIG. 2, signal flows and control relationships are indicated by solid arrows, the transport paths for the substrates 90 are indicated by dashed arrows, and supply paths for a processing solution are indicated by dash-double-dot arrows.

The controller 10 is electrically connected to the other constituents of the substrate processing apparatus 1, and principally includes a CPU and a storage device both not shown. The controller 10 has the function of controlling the constituents by using a control signal. In particular, the controller 10 determines the number N of substrates 90 based on a result of the detection of a photosensor 200 provided in the cassette rest part 20, and controls the lifters 24 (24a and 24b) and the supply mechanism 30.

The substrates 90 to be processed and processed in the substrate processing apparatus 1 are transported into and out of the substrate processing apparatus 1 while being stored in a carrier cassette not shown. The carrier cassette described in the first preferred embodiment of the present invention can accommodate a maximum of 50 substrates 90. The capacity of the carrier cassette, however, is not limited to 50. Different carrier cassettes transported to the substrate processing apparatus 1 accommodate different numbers of substrates 90 in some instances, and 50 substrates 90 are not always accommodated in each of the carrier cassettes. Each of the carrier cassettes shall accommodate substrates 90 to be subjected to a batch process (or substrates 90 to be subjected to the same process at the same time), rather than substrates 90 to be subjected to different processes. The substrates 90 accommodated in each carrier cassette shall be arranged adjacent to each other to fill successive places starting at the first place within each carrier cassette.

Such a carrier cassette is placed on the cassette rest part 20 of the substrate processing apparatus 1, with a to-be-processed surface of each of the substrates 90 extending in a substantially vertical direction. The cassette rest part 20 includes the photosensor 200 of a fingered configuration conforming to a spacing at which the substrates 90 are held by the carrier cassette. The photosensor 200 is inserted into the carrier cassette from below. The photosensor 200 detects the presence/absence of a substrate 90 in each of the places within the carrier cassette to transmit a result of the detection (the number of substrates) to the controller 10.

The cassette transport robot 21 transports the carrier cassette placed on the cassette rest part 20 toward the transfer device 22 to place the carrier cassette in a predetermined position of the transfer device 22. Thus, while being accommodated in the carrier cassette, a maximum of 50 substrates 90 transported into the substrate processing apparatus 1 are transported at the same time to the transfer device 22. The cassette transport robot 21 also receives a carrier cassette accommodating processed substrates 90 from the transfer device 22 to transport the carrier cassette to the cassette rest part 20.

The transfer device 22 has the function of adjusting the position of the substrates 90 accommodated in the carrier cassette to place the substrates 90 into a position in which the substrate transport robot 23 can receive the substrates 90. Specifically, the transfer device 22 rotates the carrier cassette about a vertical rotation axis to an orientation in which the substrate transport robot 23 can receive the substrates 90, thereby to adjust the orientation of the substrates 90 so that the to-be-processed surface of each of the substrates 90 extends substantially parallel to an X-Z plane. An elevating mechanism not shown provided in the transfer device 22 pushes out the substrates 90 upwardly from below the carrier cassette to place the substrates 90 into a position in which the substrate transport robot 23 can receive the substrates 90.

When the substrate transport robot 23 transports processed substrates 90 to the transfer device 22, the transfer device 22 stores the processed substrates 90 into a vacant carrier cassette to transfer the carrier cassette to the cassette transport robot 21.

Figure 3:
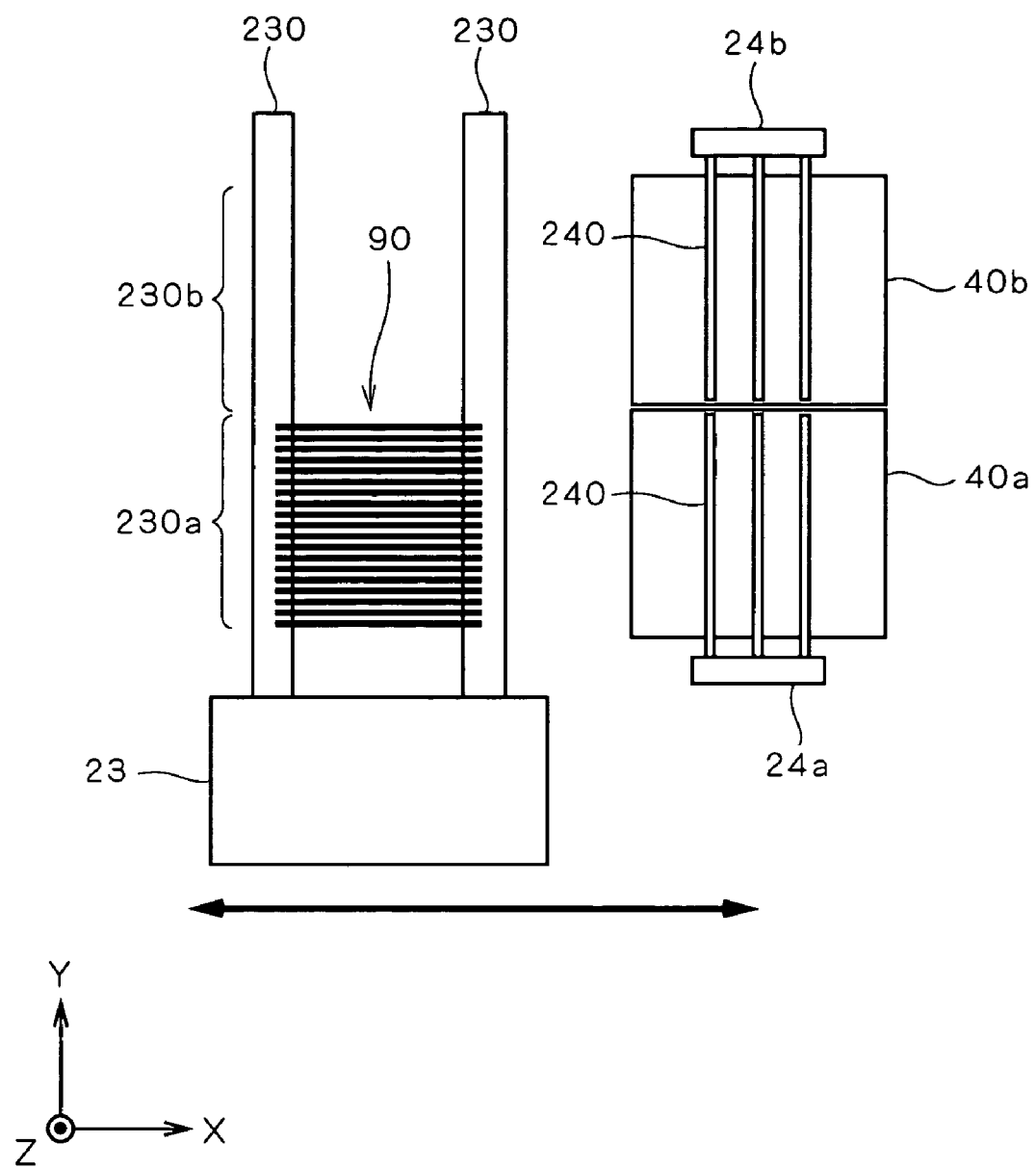
FIG. 3 is a schematic plan view showing a positional relationship between a substrate transport robot, lifters, and processing tanks in the substrate processing apparatus according to the first preferred embodiment of the present invention.

FIG. 3 is a schematic plan view showing a positional relationship between the substrate transport robot 23, the lifters 24 (24a and 24b), and the pair of processing tanks 40 (40a and 40b) in the substrate processing apparatus 1. Although only the pair of processing tanks 40a and 40b for performing the same process in parallel with each other at the same time are shown in FIG. 3, the substrate processing apparatus 1 further includes at least another pair of processing tanks 40 arranged in the Y direction so that the pairs of processing tanks 40 can perform sequential processing by supplying processing solutions depending on process steps to the pairs of processing tanks 40. That is, the substrate processing apparatus 1 can perform a batch process by using the plurality of processing tanks 40 arranged in the Y direction, and can sequentially perform process steps (pre-cleaning and post-cleaning processes and the like) different from each other by using the plurality of processing tanks 40 arranged in the X direction. The number of processing tanks 40 arranged in the Y direction is not limited to two, but not less than three processing tanks 40 may be used for a batch process.

The substrate transport robot 23 includes a chuck 230 composed of a pair of members extending substantially parallel to each other to thereby hold a maximum of 50 substrates 90 at the same time. The chuck 230 is shown in FIG. 3 as including a first chuck portion 230a for holding the first to twenty-fifth substrates 90, and a second chuck portion 230b for holding the twenty-sixth to fiftieth substrates 90. In FIG. 3, the first chuck portion 230a is shown as holding not greater than 25 substrates 90, and the second chuck portion 230b is shown as holding no substrates 90.

The substrate transport robot 23 receives a plurality of substrates 90 to be subjected to a batch process at a time from the transfer device 22, and moves in a horizontal (+X) direction to transport the plurality of substrates 90 toward the processing tanks 40. When the first chuck portion 230a is positioned over the processing tank 40a after the movement of the substrate transport robot 23, the second chuck portion 230b is positioned over the processing tank 40b at the same time.

Thus, the first chuck portion 230a transports a maximum of 25 substrates 90 to the processing tank 40a whereas the second chuck portion 230b transports a maximum of 25 substrates 90 to the processing tank 40b at the same time. In other words, the use of the substrate transport robot 23 in the substrate processing apparatus 1 is shared between the processing tank 40a and the processing tank 40b. However, the transport process for the plurality of substrates 90 to be subjected to the batch process is carried out by the substrate transport robot 23 on the processing tanks 40a and 40b at the same time, as described above. Thus, the substrate processing apparatus 1 is constructed to prevent a delay in transport process time, for example, due to sequential transport of the substrates 90 to the processing tanks 40a and 40b.

The lifters 24 (24a and 24b) are substantially similar in construction to each other, and each include a chuck 240 for holding the substrates 90 from below. The lifters 24 are constructed for independent parallel processing, and transfers and receives the substrates 90 to and from the substrate transport robot 23 by vertically moving the chuck 240. The lifters 24 move the substrate 90 held thereon in vertically upward and downward (Z) directions to transport the substrates 90 into and out of the processing tanks 40.

The lifter 24a transfers and receives substrates 90 to and from the first chuck portion 230a of the substrate transport robot 23, and transports the substrates 90 into and out of the processing tank 40a. The lifter 24b, on the other hand, transfers and receives substrate 90 to and from the second chuck portion 230b of the substrate transport robot 23, and transports the substrates 90 into and out of the processing tank 40b.

The supply mechanism 30 includes a bottle, piping, a solution feeding pump, a valve and the like, and supplies a predetermined processing solution only to at least one of the processing tanks 40 which is indicated by the controller 10 in response to a control signal from the controller 10. Different processes are performed in the processing tanks 40 depending on the types of processing solutions supplied from the supply mechanism 30. For example, a cleaning process is performed if the supply mechanism 30 supplies a cleaning solution such as pure water, a hydrogen peroxide solution and the like, and an etching process is performed if the supply mechanism 30 supplies a chemical solution for use in etching. Different processing solutions may be used in the same processing tank 40 by replacing these solutions. The processing solution supplied from the supply mechanism 30 is not limited to the solutions described above. It is, however, necessary that the supply mechanism 30 has the function of supplying the same processing solution to the processing tanks 40a and 40b (the processing tanks 40 to be subjected to the batch process) arranged in the Y direction.

Each of the processing tanks 40a and 40b has a volumetric capacity large enough to accommodate a maximum of 25 substrates 90, and is connected through piping and the like to the supply mechanism 30. Various processing solutions from the supply mechanism 30 are supplied to the processing tanks 40, as required, independently of each other.

The processing tanks 40a and 40b are capable of performing the same process at the same time. Thus, a conventional single processing tank which can accommodate a maximum of 50 substrates is replaced with the processing tanks 40a and 40b in the substrate processing apparatus 1 according to the first preferred embodiment. Each of the processing tanks 40 includes a drainage mechanism not shown for draining the disused processing solution to the outside.

The drying chamber 50 shown in FIG. 1 has the function of drying the processing solution adhering to the substrates 90 transported therein to remove the processing solution.

The construction and function of the substrate processing apparatus 1 according to the first preferred embodiment have been described above. Next, the operation of the substrate processing apparatus 1 will be described. Although the substrate processing apparatus 1 is capable of executing processes using a variety of processing solutions, description will be given on an instance where a cleaning process using a mixture (referred to hereinafter as a "cleaning solution") of sulfuric acid and hydrogen peroxide solution is performed in the processing tanks 40a and 40b.

First, the substrate processing apparatus 1 is placed in a standby condition pending the receipt of a carrier cassette containing substrates 90 from an external transport device not shown. When the carrier cassette is transported into the substrate processing apparatus 1 and placed on the cassette rest part 20, the photosensor 200 is inserted into the carrier cassette.

The result of the detection of the substrates 90 by the photosensor 200 is transmitted to the controller 10. The controller 10 determines the number (N) of substrates 90 accommodated in the carrier cassette. When the number N of substrates 90 determined is not greater than 25, the controller 10 selects only the processing tank 40a as a processing tank 40 for use in the cleaning process (batch process). When the number N of substrates 90 is not less than 26, the controller 10 selects both of the processing tanks 40a and 40b as processing tanks 40 for use in the cleaning process.

Next, the controller 10 controls the supply mechanism 30 to supply the same processing solution (cleaning solution) to the at least one selected processing tank 40. Thus, the supply mechanism 30 drives the solution feeding pump and opens a predetermined valve to execute the process of supplying the cleaning solution. Specifically, the supply mechanism 30 supplies the cleaning solution to only the processing tank 40a when only the processing tank 40a is selected because the number N is not greater than 25. The supply mechanism 30 supplies the same cleaning solution to both of the processing tanks 40a and 40b when the two processing tanks 40a and 40b are selected.

As described above, the substrate processing apparatus 1 according to the first preferred embodiment consumes only an amount of cleaning solution (processing solution) which depends on the volumetric capacity of the processing tank 40a when the number N of the substrates 90 is not greater than 25. This reduces the consumption of the processing solution, as compared with a conventional apparatus which supplies the processing solution independently of the number of substrates 90 to be subjected to the batch process.

The use of the small-sized processing tanks 40 each of which can accommodate only a maximum of 25 substrates shortens the time required for the supply and drainage of the processing solution to increase the rate of replacement of the processing solution, as compared with the use of a large-sized processing tank accommodating a maximum of 50 substrates as in the conventional apparatus. If the processing solution is replaced by using the overflow thereof, the rate of replacement of the processing solution is increased because turbulence in the Y direction in the processing solution is suppressed. Thus, when the two processing tanks 40a and 40b are used at the same time because the number N of substrates 90 is not less than 26, the substrate processing apparatus 1 produces the effect of improving the processing speed over the conventional apparatus, although consuming substantially the same amount of processing solution as the conventional apparatus.

The substrate processing apparatus 1 performs the process of transporting the substrates 90 in parallel with the process of supplying the cleaning solution to the at least one processing tank 40. First, when the photosensor 200 moves downwardly out of the carrier cassette, the cassette transport robot 21 transports the carrier cassette to the transfer device 22.

The transfer device 22 rotates the carrier cassette transported thereto to adjust the orientation of the substrates 90 so that the to-be-processed surface of each of the substrates 90 extends substantially parallel to the X-Z plane. Thus, the substrates 90 are arranged adjacent to each other in the (+Y) direction to fill the successive places starting at the first place within the carrier cassette. Further, the transfer device 22 pushes up the substrates 90 within the carrier cassette from below to move the substrates 90 upwardly. The substrates 90 in such a position are received by the chuck 230 of the substrate transport robot 23.

In this manner, the first to twenty-fifth substrates 90 are held by the first chuck portion 230a, as shown in FIG. 3. When the number N of substrates 90 per batch is not less than 26, the twenty-sixth to fiftieth substrates 90 are held by the second chuck portion 230b.

Next, the substrate transport robot 23 moves in the horizontal (+X) direction to a position in which the first chuck portion 230a is over the processing tank 40a.

After the process of supplying the cleaning solution to the selected processing tanks 40a and 40b and the process of transporting the substrates 90 to the processing tanks 40a and 40b by the substrate transport robot 23 are completed, the lifters 24a and 24b receive the substrates 90 from the substrate transport robot 23 to transport the substrates 90 into the processing tanks 40a and 40b, respectively, under the control of the controller 10.

Thus, the substrates 90 are immersed into the cleaning solution stored in the processing tanks 40a and 40b, and the process of cleaning the substrates 90 is started. Because the same cleaning solution is supplied from the supply mechanism 30 to the processing tanks 40a and 40b, moving the lifters 24a and 24b downwardly substantially at the same time allows the execution of the batch process (batch cleaning process) in the two processing tanks 40a and 40b in a similar manner to the conventional apparatus which uses the single processing tank in place of the two processing tanks 40a and 40b. In the instance shown in FIG. 3, the processing tank 40b is not selected because the twenty-sixth to fiftieth substrates 90 are absent. Accordingly, no processing solution is supplied to the processing tank 40b, and no substrates 90 are transported to the processing tank 40b, whereby the lifter 24b is not driven.

The substrates 90 are immersed in the cleaning solution for a predetermined period of time. After the cleaning process, the lifters 24a and 24b move the chuck 240 upwardly to raise the substrates 90 from the cleaning solution, and transports the substrates 90 out of the processing tanks 40a and 40b. The substrates 90 transported out of the processing tanks 40a and 40b are transferred again to the substrate transport robot 23, and are transported toward other processing tanks 40 for execution of a subsequent process step.

The substrates 90 subjected to all of the processes using the processing solution in the substrate processing apparatus 1 are transported by the substrate transport robot 23 to the drying chamber 50, and are subjected to the drying process. Thereafter, the substrates 90 are transported from the substrate transport robot 23 to the transfer device 22, and are stored into a carrier cassette.

The carrier cassette containing the processed substrates 90 is transported by the cassette transport robot 21 toward the cassette rest part 20, and is then transported by an external transport device (or an operator) for a subsequent process step.

As described hereinabove, the substrate processing apparatus 1 according to the first preferred embodiment includes the photosensor 200 for detecting the substrates 90, and the plurality of processing tanks 40a and 40b for storing the cleaning solution (processing solution). At least one processing tank 40 for use in the processing is selected from among the plurality of processing tanks 40a and 40b in accordance with the number N of substrates 90 detected by the controller 10, and the processing solution is supplied to only the at least one selected processing tank 40. The substrate processing apparatus 1 therefore reduces the consumption of the processing solution when the number N of substrates 90 is low.

The substrates 90, starting with the first substrate, are illustrated as stored adjacent to each other to fill the successive places within the carrier cassette in the first preferred embodiment. Under these conditions, the detection of only the presence of the twenty-sixth substrate 90 by the photosensor 200 enables the controller 10 to judge whether the number N of substrates 90 is less than 26 or not, thereby making a selection among the processing tanks 40. In this case, the photosensor 200 need not have the function of detecting each of the 50 substrates 90, but may have only the function of detecting the twenty-sixth substrate 90.

The first preferred embodiment illustrates the technique of reducing the consumption of the processing solution by suitably selecting the number of processing tanks 40 to be used without changing the volumetric capacity of each of the processing tanks 40. However, the technique of reducing the consumption of the processing solution depending on the number N of substrates 90 is not limited to this. For example, the consumption of the processing solution may be reduced by suitably changing a working volumetric capacity of a processing tank 40 for use in the batch process.

Figure 4:
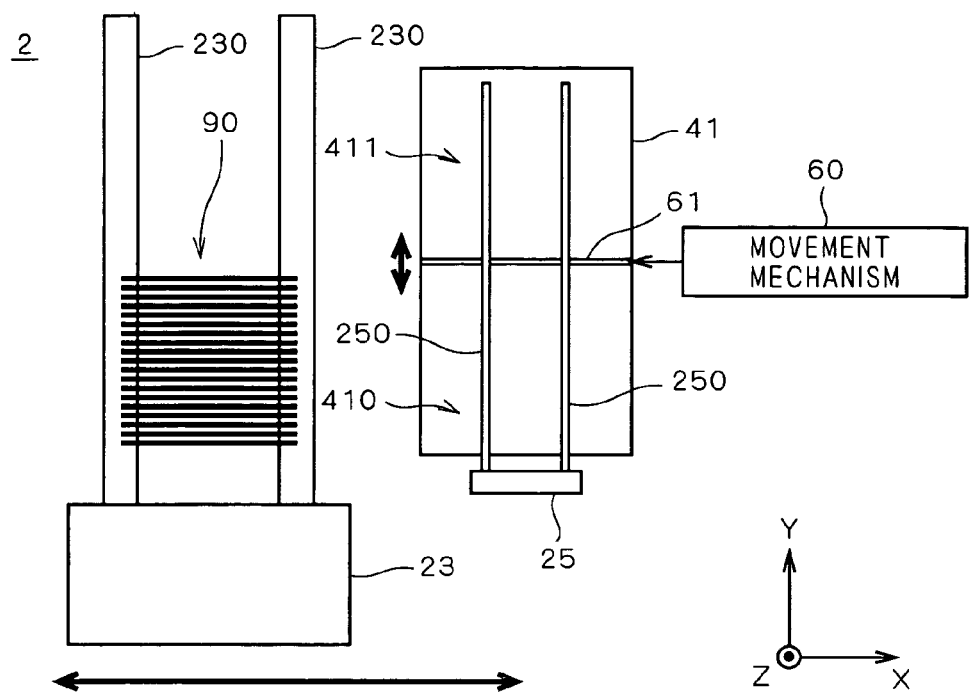
FIG. 4 is a schematic plan view showing a positional relationship between the substrate transport robot, a lifter, a processing tank and a movement mechanism in the substrate processing apparatus according to a second preferred embodiment of the present invention.

FIG. 4 is a schematic plan view showing the substrate transport robot 23, a lifter 25, and a processing tank 41 in a substrate processing apparatus 2 constructed based on such a principle according to a second preferred embodiment of the present invention. Constituents of the substrate processing apparatus 2 of the second preferred embodiment similar to those of the substrate processing apparatus 1 of the first preferred embodiment are designated by like reference numerals and characters as appropriate, and will not be described.

The substrate processing apparatus 2 includes the processing tank 41 having a volumetric capacity large enough to perform the batch process on a maximum of 50 substrates 90.

The processing tank 41 includes a partition wall 61 for partitioning the interior space of the processing tank 41 into a first space 410 and a second space 411. The partition wall 61 is reciprocally movable in the Y direction (a direction in which the substrates 90 are arranged) by a movement mechanism 60. Although not shown in FIG. 4, the supply mechanism 30 is capable of supplying the processing solution only to the first space 410. The partition wall 61 blocks off the processing solution to preclude the processing solution from being supplied to the second space 411.

In the substrate processing apparatus 2, the controller 10 determines the volumetric capacity to be used (or the working volumetric capacity) of the processing tank 41 in accordance with the number N of substrates 90. The controller 10 further controls the movement mechanism 60 to determine the position of the partition wall 61 in the Y direction, thereby changing the volumetric capacity of the first space 410. An example of the movement mechanism 60 of this type used herein may include a linear-motion mechanism employing a ball screw and a guide.

Figure 5:
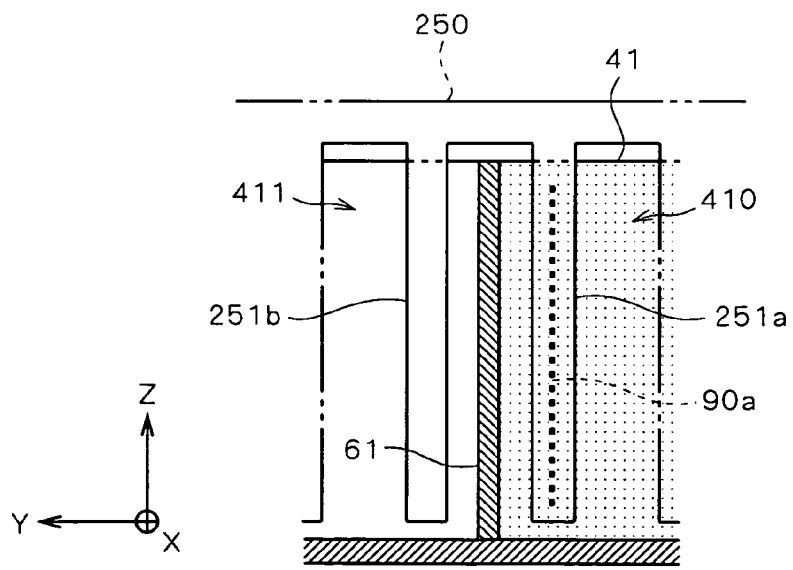
FIG. 5 is a schematic side view showing a positional relationship between the lifter and the processing tank according to the second preferred embodiment.

FIG. 5 is a schematic side view showing a positional relationship between the lifter 25 and the partition wall 61 according to the second preferred embodiment. In the instance shown in FIG. 5, the N-th substrate 90 is shown as a substrate 90a.

The lifter 25 includes a chuck 250 composed of a pair of members extending substantially parallel to each other. The chuck 250 includes a total of 50 pendent chuck portions 251 (251a, 251b, . . . ) for directly holding the individual substrates 90 so that the lifter 25 according to the second preferred embodiment holds a maximum of 50 substrates 90 at the same time. The lifter 25 uses the chuck portion 251a to hold the N-th substrate 90 (or the substrate 90a), as shown in FIG. 5.

A predetermined gap or spacing is defined between adjacent ones of the chuck portions 251. When the partition wall 61 is moved in the Y direction by the movement mechanism 60, the partition wall 61 is always placed in one of the gaps. Therefore, interference does not occur between the partition wall 61 and any of the chuck portions 251 when the lifter 25 moves the chuck 250 downwardly.

The operation of the substrate processing apparatus 2 according to the second preferred embodiment constructed as discussed above will be described. After the controller 10 detects the number N of substrates 90 in a similar manner to the first preferred embodiment, the controller 10 then determines the volumetric capacity (or the working volumetric capacity) required for the processing of the N substrates 90. Then, the controller 10 changes the position of the partition wall 61 so that the volumetric capacity of the first space 410 is the minimum volumetric capacity not less than the working volumetric capacity.

In other words, the partition wall 61 in the substrate processing apparatus 2 is positioned between the chuck portion 251a positioned farthest from the proximal end of the chuck 250 and holding the substrate 90a and the chuck portion 251b positioned closest to the proximal end of the chuck 250 of all chuck portions that hold no substrates 90.

After the position of the partition wall 61 is determined, the controller 10 moves the chuck 250 upwardly so as not to cause the interference between the chuck 250 of the lifter 25 and the partition wall 61 to be moved. Then, the controller 10 controls the movement mechanism 60 to move the partition wall 61 to the determined position, thereby determining the volumetric capacity of the first space 410 (or determining the working volumetric capacity of the processing tank 41).

The controller 10 further controls the supply mechanism 30 to supply an amount of cleaning solution depending on the working volumetric capacity to the processing tank 41. This enables the substrate processing apparatus 2 according to the second preferred embodiment to reduce the consumption of the processing solution in accordance with the number N of substrates 90. Above described is the process of supplying the cleaning solution in the second preferred embodiment.

The process of transporting the substrates 90 is carried out in parallel with the process of supplying the cleaning solution in the substrate processing apparatus 2 in a similar manner to the substrate processing apparatus 1. In the transporting process of the second preferred embodiment, all of the substrates 90 transported by the substrate transport robot 23 at the same time are received by the chuck 250 of the lifter 25, and transported into the processing tank 41 (only the first space 410). The transporting processing of the second preferred embodiment is substantially similar to that of the first preferred embodiment except for the transfer of the substrates 90 between the substrate transport robot 23 and the lifter 25.

After the completion of the cleaning process, the lifter 25 moves the chuck 250 upwardly to raise the substrates 90 out of the first space 410 of the processing tank 41. The substrates 90 are then transferred to the substrate transport robot 23. The substrate transport robot 23 transports the received substrates 90 for execution of a subsequent process step. Subsequently, processes similar to those of the first preferred embodiment are carried out in the substrate processing apparatus 2 of the second preferred embodiment.

As described hereinabove, the substrate processing apparatus 2 according to the second preferred embodiment moves the partition wall 61 in accordance with the number N of substrates 90 to determine the working volumetric capacity of the processing tank 41. Additionally, the substrate processing apparatus 2 supplies an amount of processing solution which depends on the working volumetric capacity from the supply mechanism 30 to reduce the consumption of the processing solution.

The movement mechanism 60 may be constructed to move the partition wall 61 upwardly and downwardly to partition the processing tank 41 into the first space 410 and the second space 411. The chuck 250 of the lifter 25 may have, for example, a telescopic structure for extension and retraction in the Y direction in accordance with the position of the partition wall 61.

In the substrate processing apparatuses 1 and 2 according to the first and second preferred embodiments, the substrates 90 are illustrated as stored adjacent to each other to fill the successive places starting at the first place within the carrier cassette to be transported. The substrates 90 within the carrier cassette, however, need not be stored in such a manner, but the substrates 90 may be rearranged within the carrier cassette.

FIG. 6 shows a transport arm 220 of a transfer device 22a for a substrate processing apparatus 3 constructed based on such a principle according to a third preferred embodiment of the present invention. The construction of the substrate processing apparatus 3 differs from that of the substrate processing apparatus 1 mainly in that the transfer device 22a includes the transport arm 220.

The transport arm 220 is provided over a carrier cassette transported to the transfer device 22a. The transport arm 220 is reciprocally movable in the Y direction by a drive mechanism not shown, and is vertically movable in the Z direction. This makes the transport arm 220 accessible to any one of the places within the carrier cassette transported to the transfer device 22a.

The transport arm 220 includes a plurality of support pins 221 provided on lower end portions thereof for supporting an edge of a substrate 90 from below. The support pins 221 are retractable and extendable in the Y direction between a retracted position and a supporting position.

To take a substrate 90 out of a carrier cassette, the transport arm 220 moves downwardly, with the support pins 221 in the retracted position. After the transport arm 220 is moved downwardly to a predetermined position and enters the carrier cassette to a sufficient depth, the support pins 221 are extended to the supporting position. As the transport arm 220 moves upwardly with the support pins 221 in the supporting position, the substrate 90 is supported by the support pins 221 and taken out of the carrier cassette.

To transport a substrate 90 into a carrier cassette, on the other hand, the transport arm 220 moves in the Y direction, selects a place within the carrier cassette, and then moves downwardly, while the substrate 90 is supported by the support pins 221. At the time that the substrate 90 is held by the selected place within the carrier cassette, the transport arm 220 retracts the support pins 221 into the retracted position, and then moves upwardly.

The operation of the substrate processing apparatus 3 having the above-mentioned construction will be briefly described. The controller determines the number N of substrates 90 after the photosensor 200 detects the substrates 90 within a carrier cassette.

Next, under the control of the controller 10, the transfer device 22a uses the transport arm 220 to transfer a substrate 90 stored in any place subsequent to the N-th place within the carrier cassette to a place (vacant place) containing no substrate 90 among the first to N-th places. In other words, the transfer device 22a adjusts the positions of substrates 90 in accordance with the number N of substrates 90. At this time, the controller 10 stores information about the place from which a substrate 90 is transferred and the place to which the substrate 90 is transferred in the form of historical information.

This causes the substrates 90 to be stored adjacent to each other to fill the first to N-th successive places within the carrier cassette. The subsequent processes may be performed in a similar manner to the first and second preferred embodiments. It should be noted that the substrate processing apparatus 3 performs the process of returning a substrate 90 transferred within the carrier cassette to its original place in accordance with the above-mentioned historical information when substrates 90 subjected to the drying process are returned again to the transfer device 22a. Thus, the transfer device 22a restores the sequence of the substrates 90 within the carrier cassette, whereby the substrates 90 are transported out of the substrate processing apparatus 3 in the order in which the substrates 90 are transported into the substrate processing apparatus 3.

As described hereinabove, the transfer device 22a in the substrate processing apparatus 3 according to the third preferred embodiment adjusts the positions of the substrates 90 within the carrier cassette in accordance with the number N of substrates 90 to transfer the substrates 90 to the substrate transport robot 23. This eliminates the need for an apparatus upstream of the substrate processing apparatus 3 to previously adjust the positions of the substrates 90 (or how the substrates 90 are stored) within the carrier cassette. If any substrate 90 within the carrier cassette is removed because of a defect or the like to cause a break in the successive substrates 90, the substrate processing apparatus 3 is capable of rearranging the substrates 90 so as to reduce the volumetric capacity required for the processing, thereby producing effects similar to those of the substrate processing apparatuses 1 and 2 of the first and second preferred embodiments.

The technique of adjusting the positions of substrates 90 within the carrier cassette in accordance with the number N of substrates 90 is not limited to this. For example, the substrates 90 may be rearranged after the orientation of the carrier cassette is changed so that the to-be-processed surface of each of the substrates 90 extends in a horizontal direction.

Further, all substrates 90 stored in a first carrier cassette may be transferred into a second carrier cassette. In this case, the first carrier cassette may contain substrates 90 to be subjected to different processes. Specifically, only some of the substrates 90 to be subjected to the same process at the same time may be transferred to the second carrier cassette, and then transferred to the substrate transport robot 23.

The substrate processing apparatus 3 is illustrated as constructed such that the transfer device 22a is substituted for the transfer device 22 of the substrate processing apparatus 1. The substrate processing apparatus 3, however, may be constructed such that the transfer device 22a is substituted for the transfer device 22 of the substrate processing apparatus 2.

Although the preferred embodiments according to the present invention have been described above, the present invention is not limited to these preferred embodiments. For example, the transfer device 22 may include the photosensor 200. In other words, the number N of substrates 90 accommodated in each carrier cassette may be detected in any process step before the completion of the process of transporting the substrates 90. It is, however, preferable for the substrate processing apparatuses 1, 2 and 3 to detect the number N of substrates 90 as early as possible for the purpose of completing the process of supplying the cleaning solution in accordance with the number N of substrates 90 prior to the completion of the process of transporting the substrates 90.

The substrate processing apparatus 1 may acquire information about the substrates 90 accommodated in a carrier cassette (e.g., a lot number, the positions of the substrates 90 within the carrier cassette, the number of substrates, and the like) from an upstream apparatus when the substrates 90 are transported to the substrate processing apparatus 1. In this case, it is unnecessary to provide a detection mechanism such as the photosensor 200.

The substrate transport robot 23 has the function of transporting a maximum of 50 substrates 90 at the same time. Alternatively, a pair of transport robots each transporting a maximum of 25 substrates 90 may be arranged in the Y direction in opposed relation to each other. Only the lifter 25 of the second preferred embodiment may be used in place of the lifters 24a and 24b of the first preferred embodiment.

The processing tanks 40a and 40b arranged in the Y direction are illustrated as each having a volumetric capacity large enough to process a maximum of 25 substrates 90, but need not be identical in volumetric capacity with each other. That is, the processing tanks 40a and 40b different in volumetric capacity from each other may be used to accomplish the batch process. As an example, the processing tank 40a may have a volumetric capacity large enough to accommodate a maximum of 15 substrates 90 whereas the processing tank 40b has a volumetric capacity large enough to accommodate a maximum of 35 substrates 90. In this case, the controller 10 selects only the processing tank 40a when performing the batch process on one to 15 substrates 90, selects only the processing tank 40b when performing the batch process on 16 to 35 substrates 90, and selects both of the processing tanks 40a and 40b when performing the batch process on 36 to 50 substrates 90. Thus, the use of the processing tanks 40a and 40b different in volumetric capacity from each other allows a flexible response to the number of substrates per batch to further reduce the consumption of the processing solution.

Further, the first preferred embodiment may be modified such that the processing tanks 40a and 40b for performing the batch process are arranged in the X direction, rather than in the Y direction, and such that the processing tank 40a has a volumetric capacity large enough to accommodate a maximum of 25 substrates 90 whereas the processing tank 40b has a volumetric capacity large enough to accommodate a maximum of 50 substrates 90. In this modification, the substrate transport robot 23 may transport substrates 90 to only the processing tank 40a when the number of substrates per batch ranges from one to 25, and transport substrates 90 to only the processing tank 40b when the number of substrates per batch ranges from 25 to 50.

The mechanism for moving the partition wall 61 in the second preferred embodiment is not limited to the linear-motion mechanism employing the ball screw. As an example, a bellows may be mounted between a surface of the partition wall 61 which is farther from the proximal end of the chuck 250 and an inner surface of the processing tank 41 which is opposed to the above-mentioned surface of the partition wall 61, and an amount of gas which depends on the number of substrates 90 per batch is supplied into the bellows to move the partition wall 61 in the (−Y) direction. In this case, the working volumetric capacity of the processing tank 41 is decreased by the expansion of the bellows if a seal between the partition wall 61 and the processing tank 41 is not so tight. Therefore, the consumption of the processing solution is reduced in accordance with the volumetric capacity of the gas supplied into the bellows.

While the invention has been described in detail, the foregoing description is in all aspects illustrative and not restrictive. It is understood that numerous other modifications and variations can be devised without departing from the scope of the invention.

What is claimed is:

1. A substrate processing apparatus, comprising:
   a plurality of processing tanks each capable of processing a predetermined number M of substrates;
   a detector for detecting the number N of substrates constituting a set of substrates to determine whether the number N is over the number M or not;
   a selector for selecting a single target processing tank among said plurality of processing tanks when N is not over M, and selecting a plurality of target processing tanks among said plurality of processing tanks when N>M;

a supply mechanism for supplying the processing liquid to said single target processing tank when N is not over M, and supplying the processing liquid to said plurality of target processing tanks when N>M; and a transport mechanism for transporting all the substrates to the single target processing tank when N is not over M, and transporting respective sub-sets of the substrates to said plurality of target processing tanks respectively when N>M.

2. The substrate processing apparatus according to claim 1, further comprising:

a transfer mechanism for transferring and receiving substrates to and from said transport mechanism and for adjusting the position of the substrates for the transfer of the substrates to said transport mechanism in accordance with the number N of substrates detected by said detector.

3. The substrate processing apparatus according to claim 2, wherein said transport mechanism includes:

a first transport mechanism portion for transporting the substrates in a horizontal direction between said transfer mechanism and a position lying over said plurality of processing tanks; and a second transport mechanism portion for transferring and receiving the substrates to and from said first transport mechanism portion and for transporting the substrates upwardly and downwardly between said first transport mechanism portion and the interior of said plurality of processing tanks.

4. A substrate processing apparatus for performing a predetermined process on a substrate, comprising:

a processing tank capable of accommodating a plurality of substrates and storing a processing liquid therein;

a detector for detecting the number of substrates;

a volumetric capacity determiner for determining a working volumetric capacity in said processing tank in accordance with the number of substrates detected by said detector;

a volumetric capacity changing mechanism for changing the volumetric capacity of said processing tank to the working volumetric capacity determined by said volumetric capacity determiner;

a supply mechanism for supplying the processing liquid to the processing tank whose volumetric capacity is changed to the working volumetric capacity by said volumetric capacity changing mechanism; and a transport mechanism for transporting the substrates to the processing tank whose volumetric capacity is changed to the working volumetric capacity by said volumetric capacity changing mechanism.

5. The substrate processing apparatus according to claim 4, wherein said volumetric capacity changing mechanism includes:

a partition wall disposed within said processing tank for partitioning an interior space of said processing tank into a first interior space having the working volumetric capacity and a second interior space other than said first interior space; and a movement mechanism for moving said partition wall within said processing tank.

6. The substrate processing apparatus according to claim 4, further comprising a transfer mechanism for transferring and receiving substrates to and from said transport mechanism and for adjusting the position of the substrates for the transfer of the substrates to said transport mechanism in accordance with the number of substrates detected by said detector.

7. The substrate processing apparatus according to claim 6, wherein said transport mechanism includes:

a first transport mechanism portion for transporting the substrates in a horizontal direction between said transfer mechanism and a position lying over said processing tank; and a second transport mechanism portion for transferring and receiving the substrates to and from said first transport mechanism portion and for transporting the substrates upwardly and downwardly between said first transport mechanism portion and the interior of said processing tank.

* * * * *